US 11,990,883 B2

(12) United States Patent
Romanov et al.

(10) Patent No.: US 11,990,883 B2
(45) Date of Patent: May 21, 2024

(54) ELECTRONICALLY CONTROLLABLE RESISTOR

(71) Applicant: Closed-up Joint-Stock Company DRIVE, Novosibirsk (RU)

(72) Inventors: Yuriy I. Romanov, Novosibirsk (RU); Stanislav V. Maletskiy, Novosibirsk (RU)

(73) Assignee: Drive CJSC, Novosibirsk (RU)

( * ) Notice: Subject to any disclaimer, the term of this patent is extended or adjusted under 35 U.S.C. 154(b) by 429 days.

(21) Appl. No.: 17/432,489

(22) PCT Filed: Apr. 10, 2019

(86) PCT No.: PCT/RU2019/000233
§ 371 (c)(1),
(2) Date: Aug. 20, 2021

(87) PCT Pub. No.: WO2020/209745
PCT Pub. Date: Oct. 15, 2020

(65) Prior Publication Data
US 2022/0121233 A1   Apr. 21, 2022

(51) Int. Cl.
*G05F 1/56*   (2006.01)
*G05F 1/46*   (2006.01)
*H03H 11/46*  (2006.01)

(52) U.S. Cl.
CPC .............. *H03H 11/53* (2013.01); *G05F 1/46* (2013.01); *G05F 1/56* (2013.01)

(58) Field of Classification Search
CPC ... G05F 1/46; G05F 1/56; G05F 1/461; G05F 1/465; G05F 1/468; G05F 1/561;
(Continued)

(56) References Cited

U.S. PATENT DOCUMENTS

| 2014/0253069 A1* | 9/2014 | Utsunomiya | ........... G05F 1/565 323/273 |
| 2019/0149146 A1* | 5/2019 | Tang | ....................... H01L 23/64 327/109 |
| 2023/0236615 A1* | 7/2023 | Pang | ....................... G05F 1/618 323/273 |

FOREIGN PATENT DOCUMENTS

| EP | 0260346 A2 | 3/1988 |
| EP | 3182243    | 6/2017 |

(Continued)

OTHER PUBLICATIONS

Electronic Circuits: Handbook for Design and Application, by U. Tietze et al., Springer, 1978, Fig. 5.19.

*Primary Examiner* — Nguyen Tran
(74) *Attorney, Agent, or Firm* — Patentagar PLLC; Alexander Rabinovich

(57) ABSTRACT

An electronically controllable resistor (ECR) designed for changing the resistance of a portion of a circuit comprises a voltage converter, a subtractor, an instrumental resistor (IR), and an executive element (EE) which can include at least one MOSFET or IGBT or a vacuum tube. There are a high-potential and two control voltage sources. The converter, which can use logarithmic amplifiers or be digital, is adapted to multiply the high-potential voltage by one of the control voltages and divide by another one. The resulting intermediate voltage is applied to the subtractor and compared therein with a voltage drop on the IR created by the current flowing through the IR and the EE. Thus, the ECR resistance can be regulated. The ECR makes it possible to achieve a wide range of resistance values, down to ultra-small values, while maintaining tolerance to destabilizing factors, including temperature. Also claimed is an ECR control circuit.

9 Claims, 7 Drawing Sheets

(58) Field of Classification Search
CPC ......... G05F 1/563; G05F 1/571; H03H 11/53; H03H 11/52
See application file for complete search history.

(56) References Cited

FOREIGN PATENT DOCUMENTS

| | | |
|---|---|---|
| JP | S51114049 A | 10/1976 |
| RU | 2658681 | 6/2018 |
| SU | 1807554 | 4/1993 |

\* cited by examiner

ELECTRONICALLY CONTROLLABLE RESISTOR

CROSS-REFERENCE TO RELATED APPLICATIONS

This application is a Continuation-in-part U.S. National phase application of International application PCT/RU2019/000233 filed on Apr. 10, 2019, the International application being hereby incorporated by reference in its entirety.

BACKGROUND OF THE INVENTION

1. Field of the Invention

The present invention relates to electrical engineering and electronics and is intended to control changes of resistance of a portion of an electric circuit using electronic means.

2. Description of Related Art

Known in the art have been means to electronically control resistance of a portion of an electric circuit with the use of voltage controllable variable resistors (ECR). One of those designs, specifically, an ECR including a field effect transistor (FET) is described in *Electronic Circuits: Handbook for Design and Application*, by U. Tietze et al., Springer, 1978, FIG. 5.19. Controlling voltage is applied directly to an input of the ECR represented by the gate of a FET. As the controlling voltage varies, so does the resistance of the FET channel. In this way, control of resistance of a portion of an electric circuit (and, consequently, control of voltage, current and power of wanted electrical signals therein) is carried out.

A common feature of this design and the present invention is a MOSFET with three terminals.

Disadvantages of the known solution are: a narrow range of voltages between the source and drain of the FET where an approximately linear dependence between the controlling voltage and resistance of the electronically controllable resistor ECR (namely, the resistance of the FET channel) is observed; spread in values of control characteristics which does not make it possible to achieve sufficient accuracy of setting a resistor value; temperature dependence of control characteristics which does not allow to have stable characteristics across a temperature range; dependence of resistor values from the voltage between the source and drain of the FET.

Also known (from the Russian patent RU2658681, G05F 1/59, publ. Jun. 26, 2018) has been a design where an ECR comprises a MOS-transistor, a resistor of the rate of Rb r connected in parallel to the MOS-transistor and being bridged thereby, a controlling voltage converter, and a subtractor.

As the controlling voltage changes, so does the resistance of the MOS-transistor channel and, accordingly, the resistance of the ECR (from Rb r when the MOS-transistor is closed to practically zero when the MOS-transistor is completely open). Due to that, controlling of the resistance of a portion of an electrical circuit takes place.

Common features of the proposed design and the prior art are:
- a converter of controlling voltage;
- a subtractor;
- a MOS-transistor with three terminals, the gate of the transistor being connected to an output of the subtractor.

The prior art apparatus appears to suffer from insufficient accuracy of controlling resistance of a portion of an electric circuit, especially where affected by destabilizing factors, such as ambient temperature.

A conventional design is disclosed in JP S51 114049A dated Oct. 7, 1976, in which an ECR includes a series circuit of a Darlington transistor and an instrument resistor, as well as a voltage converter that receives voltage from the ECR's high-potential terminal at one of its inputs, wherein digital code is sent to the ECR's control inputs. The voltage converter's output is connected to the control input of the Darlington transistor via a subtractor, and the subtractor's inverting terminal is connected to the measurement resistor. According to this solution, the function of the voltage converter is to add the control signal represented by digital code to the voltage at the high-potential terminal of the ECR. Therefore, it becomes impossible to maintain stable resistance of the ECR in a relatively wide voltage range at its high-potential terminal. Also, this solution does not allow to control the ECR with analog voltages.

Another prior art solution is disclosed in EP 0260346 A2 dated Mar. 23, 1988, in which an ECR includes a series circuit of a MOS transistor and an instrument resistor, as well as a subtractor and a voltage converter that receives digital code at its control inputs, wherein the signal, which is used to control a MOS transistor, represents a voltage difference between high-potential terminal of the ECR and a control signal obtained by summing the measurement resistor voltage and digital code.

The main drawback of this solution is low resistance stability of the ECR under destabilizing factors. Also, this solution does not allow to control the ECR with analog voltages.

Yet another conventional solution is disclosed in EP 3,182,243 A1 dated Jun. 21, 2017, in which an ECR includes a series circuit of a MOS transistor and an instrument resistor, as well as a subtractor, wherein a signal from the instrument resistor is applied to the inverting terminal of the subtractor, and a signal from a control resistor signal is sent to the noninverting terminal of the subtractor.

However, this solution does not allow to control the ECR with either analog voltages or digital codes. Here, this control is implemented through the resistance value of the control resistor, which significantly limits applicability of this solution.

An apparatus disclosed in the Soviet inventor's certificate SU1807554, H03G 3/30, publ. Apr. 7, 1993, is believed to be the closest analog (prototype) of the present invention.

The prototype includes an ECR comprising two reference resistors and two precision multipliers, to thus enhance the precision of setting a given value of resistance. A chip 525ПС3 or its analogs, such as AD534, is used in the apparatus as a precision analog multiplier functioning as a voltage converter. The resistance of the ECR is proportional to a preferred value of the reference resistor, which acts as an instrument resistor, and can vary in reverse proportion to a change of controlling voltage at an input of the voltage converter.

Common features of the prototype and the proposed design are:
- terminals for connecting to a first source of controlling voltage and to a common wire, as well as a high-potential and a low-potential terminals for connecting the ECR to an electric circuit;
- a voltage converter, whose first input is connected to the terminal of the ECR to be connected to the source of first controlling voltage, and whose third input is connected to the high-potential terminal of the ECR;
a subtractor;
an instrument resistor;
a connection of one of inputs of the subtractor to an output of the voltage converter;
a connection of the other input of the subtractor to a first terminal of the instrument resistor;
a connection of the low-potential terminal of the ECR to the terminal for connecting to the common wire In the prototype, however, the current via the instrument resistor flows to the common wire through the limiting resistor (in accordance to the 525ИС3 or, what is the same, to AD534). In real practice, consequently, there exists a dependence of the resistance of the electronically controllable resistor on the resistance of the limiting resistor, and neglecting this component is only possible where the value of the instrument resistor is many times that of the limiting resistor. Therefore, it is impossible in the prototype to achieve sufficiently low resistance of the ECR frequently needed in real practice. Additionally, achieving small values of the ECR resistance is limited by the reverse dependence thereof from the controlling voltage, so as to provide small values of the resistance, the controlling voltage should be as big as impractical. On the other hand, it is impossible in the prototype to have a direct dependence of the resistance from the controlling voltage.

SUMMARY OF THE INVENTION

The object of the present invention is to overcome disadvantages of the prior art by providing a preferably low-ohmic ECR enabling fine setting of the desired resistance value while maintaining tolerance to destabilizing factors including temperature changes over wide range.

The technical result, believed impossible to be achieved in prior art, lies in widening the range of values of the rated resistance of the ECR, mainly to the side of small values thereof. The value of the resistance of the portion of the electric circuit where the ECR is placed can be as low as possible, with the technical implementation in view, while high tolerance to destabilizing factors is maintained.

The ECR according to the present invention is provided with a terminal for connecting to a first source of controlling voltage, with a terminal for connecting to a common wire, and with a high-potential terminal and a low-potential terminal for incorporating the ECR into an electric circuit. The ECR comprises a voltage converter, an instrument resistor, and a subtractor. The voltage converter has three inputs. A first input is connected to the terminal for connecting to a first source of controlling voltage, and a third input is connected to the high-potential terminal of the ECR. A first input of the subtractor is connected to an output of the voltage converter, a second input of the subtractor is connected to a first terminal of the instrument resistor, and the low-potential terminal is connected to the terminal for connecting to a common wire, The above object is achieved in this ECR by providing same with an executive element and with an additional terminal for connecting to a second source of controlling voltage. A first terminal of the executive element is connected to the first terminal of the instrument resistor, a second terminal of the executive element is connected to an output of the subtractor, and a third terminal of the executive element is connected to the high potential terminal. A second terminal of the instrument resistor is connected to the low-potential terminal, and a second input of the voltage converter is connected to the additional terminal for connecting to a second source of controlling voltage.

The voltage converter is adapted to multiply the high-potential voltage by the ratio of the value of one controlling voltage to the value of another controlling voltage to generate an intermediate voltage signal. Thus, the voltage subtractor becomes able to regulate the resistance of the electronically controllable resistor in the function of the difference between the intermediate voltage signal and a voltage drop signal picked up from the instrumental resistor due to current flowing through the executive element and the instrumental resistor.

Yet another feature of the proposed ECR is that the voltage converter can include three logarithmic amplifiers, parallel to each other, an adder, an additional subtractor, and an input of a first of the three logarithmic amplifiers is connected to the high-potential terminal, an input of a second of the three logarithmic amplifiers is connected to the source of one of the controlling voltages, an input of a third of the three logarithmators is connected to the source of another of the controlling voltages, outputs of the first and second logarithmic amplifiers are connected to inputs of the adder, an output of the adder is connected to a non-inverting input of the additional subtractor, an output of the third logarithmic amplifier is connected to an inverting input of the additional subtractor, an output of the additional subtractor is connected to an input of the exponential converter, and an output of the exponential converter is the output of the voltage converter.

Still another feature of the invention lies in that the voltage converter comprises a digital computing unit, an analog-to-digital converter, and a digital-to-analog converter. An input of the analog-to-digital converter is connected to the third input of the voltage converter, an output of the analog-to-digital converter is connected to one input of the digital computing unit, whereas another input of the digital computing unit is connected to the second input of the voltage converter. An output of the digital computing unit is connected to an input of the digital-to-analog converter, and an output of the digital-to-analog converter is connected to the output of the voltage converter. The first input of the voltage converter includes an at least single-bit digital data bus connected to the terminal of the electronically controllable resistor for connecting to the first source of controlling voltage, and the third input of the voltage converter includes an at least single-bit digital data bus connected to the terminal of the electronically controllable resistor for connecting to the second source of controlling voltage.

Also, the executive element of the electronically controllable resistor can include at least one FET, particularly MOSFET.

Alternatively, the executive element of the electronically controllable resistor can include at least one bipolar transistor, particularly insulated-gate bipolar transistor.

Further alternatively, the executive element of the electronically controllable resistor can include at least one electronic tube.

The above-described design makes it possible to use the proposed ECR resistor in apparatuses where it is required to control resistance based on both—direct, or inverse dependence from controlling voltage, as well as based on the dependence from both variable controlling voltages. Also, due to using executive element that can pass large current, it becomes possible to obtain not only preferred large values of the instrument resistor, as in the prototype, but also preferred small values of the instrument resistor and, consequently, of the ECR.

Also presented for a patent protection within the scope of the present invention is a control circuit for controlling an ECR, the control circuit comprising a voltage converter and a subtractor. The voltage converter has a first, a second, and a third inputs. The first input is for connecting the converter to a source of a first control voltage, the second input of the voltage converter is for connecting to a source of a second control voltage, and the third input is for connecting to a source of a high-potential voltage. A first input of the subtractor is connected to an output of the voltage converter, and a second input of the subtractor is connected to a first terminal of an instrument resistor of the ECR, whereas an output of the subtractor is connected to a control input of an executive element of the ECR. The voltage converter is adapted to multiply the high-potential voltage by the ratio of the value of one controlling voltage to the value of another controlling voltage to generate an intermediate voltage signal. Thus, the voltage subtractor is able to regulate the resistance of the electronically controllable resistor in the function of the difference between the intermediate voltage signal and a voltage drop signal picked up from the instrumental resistor due to current flowing through the executive element and the instrumental resistor.

The voltage converter of the control circuit can comprise three logarithmic amplifiers connected in parallel to each other, an adder, an additional subtractor, and an exponential converter. Inputs of the logarithmic amplifiers are the inputs of the voltage connectors. An input of the first logarithmic amplifier is connected to the source of a high-potential voltage, an input of the second logarithmic amplifier is connected to the source of the one of the control voltages, whereas an input of the third logarithmic amplifier is connected to the source of the other of the control voltages. Outputs of the first and the second logarithmic amplifiers are connected to inputs of the adder. An output of the adder is connected to a non-inverting input of the additional subtractor, whereas an output of the third logarithmic amplifier is connected to an inverting input of the additional subtractor, an output of the additional subtractor is connected to an input of the exponential converter, and an output of the exponential converter is the output of the voltage converter.

Alternatively, the voltage converter of the control circuit can comprise a digital computing unit, an analog-to-digital converter, and a digital-to-analog converter. An input of the analog-to-digital converter is connected to the third input of the voltage converter. Applied to inputs of the digital computing unit are a signal from an output of the analog-to-digital converter and controlling voltages from the inputs of the voltage converter, each of the inputs presenting a digital bus. An input of the digital-to-analog converter is connected to an output of the digital computing unit, an output of the digital-to-analog converter is connected to an output of the voltage converter.

BRIEF DESCRIPTION OF DRAWINGS

The essence of the proposed design is further explained with reference to accompanying drawings, where.

DETAILED DESCRIPTION OF THE INVENTION

For purposes of better understanding of the present invention, the following definitions are introduced.

Voltage converter—a component of an electric circuit adapted to convert controlling voltages into an intermediate signal, the value of the intermediate signal being able to be set equivalent (equal) to a set ratio of signals from sources of controlling voltages. The voltage converter can have various implementations, including, but not limited to, analog IC, microprocessors, programmed logic arrays, etc.

Executive element—a component of an electric circuit provided with three terminals, one of the terminals being a control input. The executive element can have various implementations, including, but not limited to, those using MOS transistors, bipolar transistors (including those with insulated gate), electronic tubes, etc.

Figure 1:
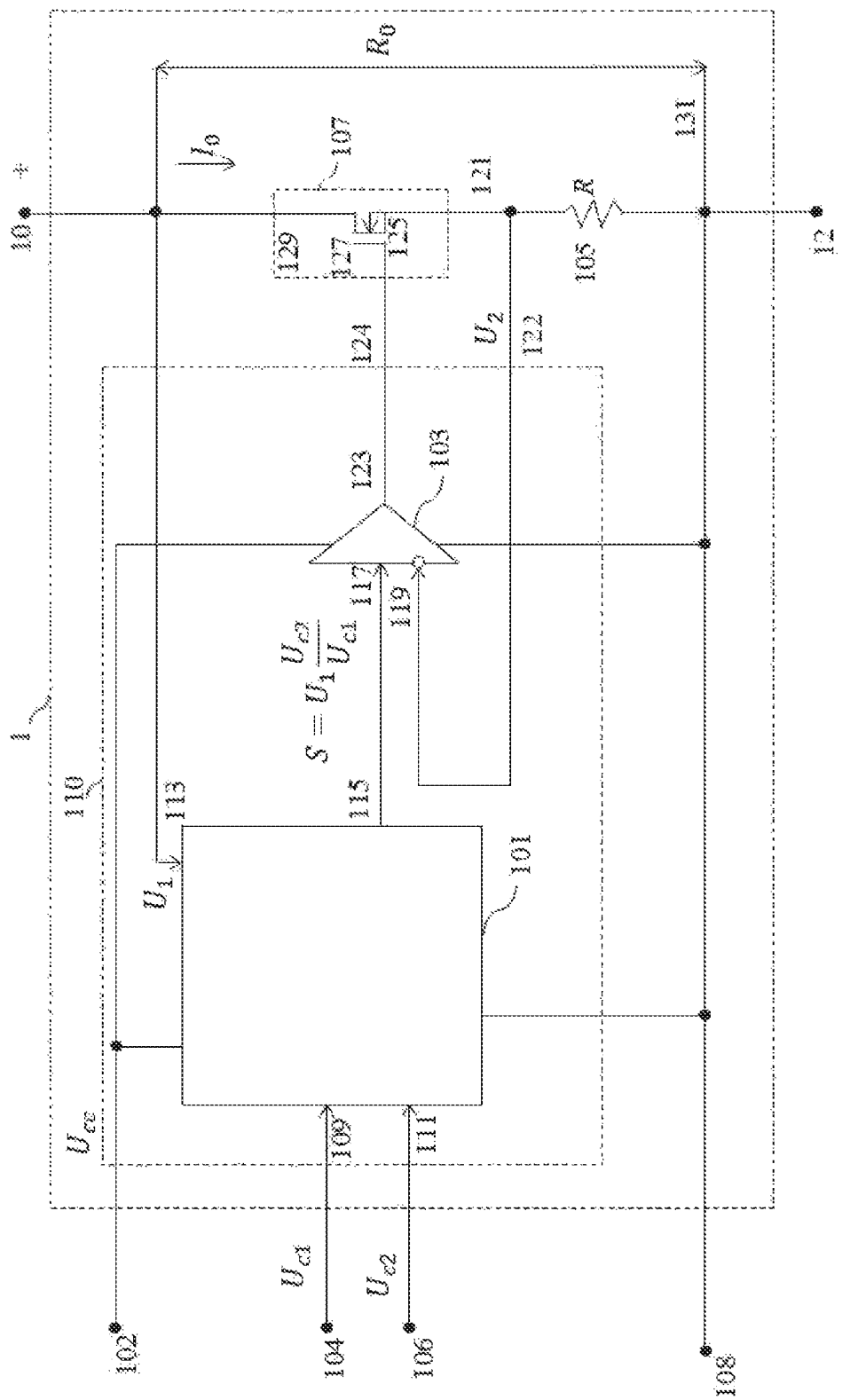
FIG. 1 presents one of possible variants of an analog implementation of the electronically controllable resistor according to the present invention.
Figure 2:
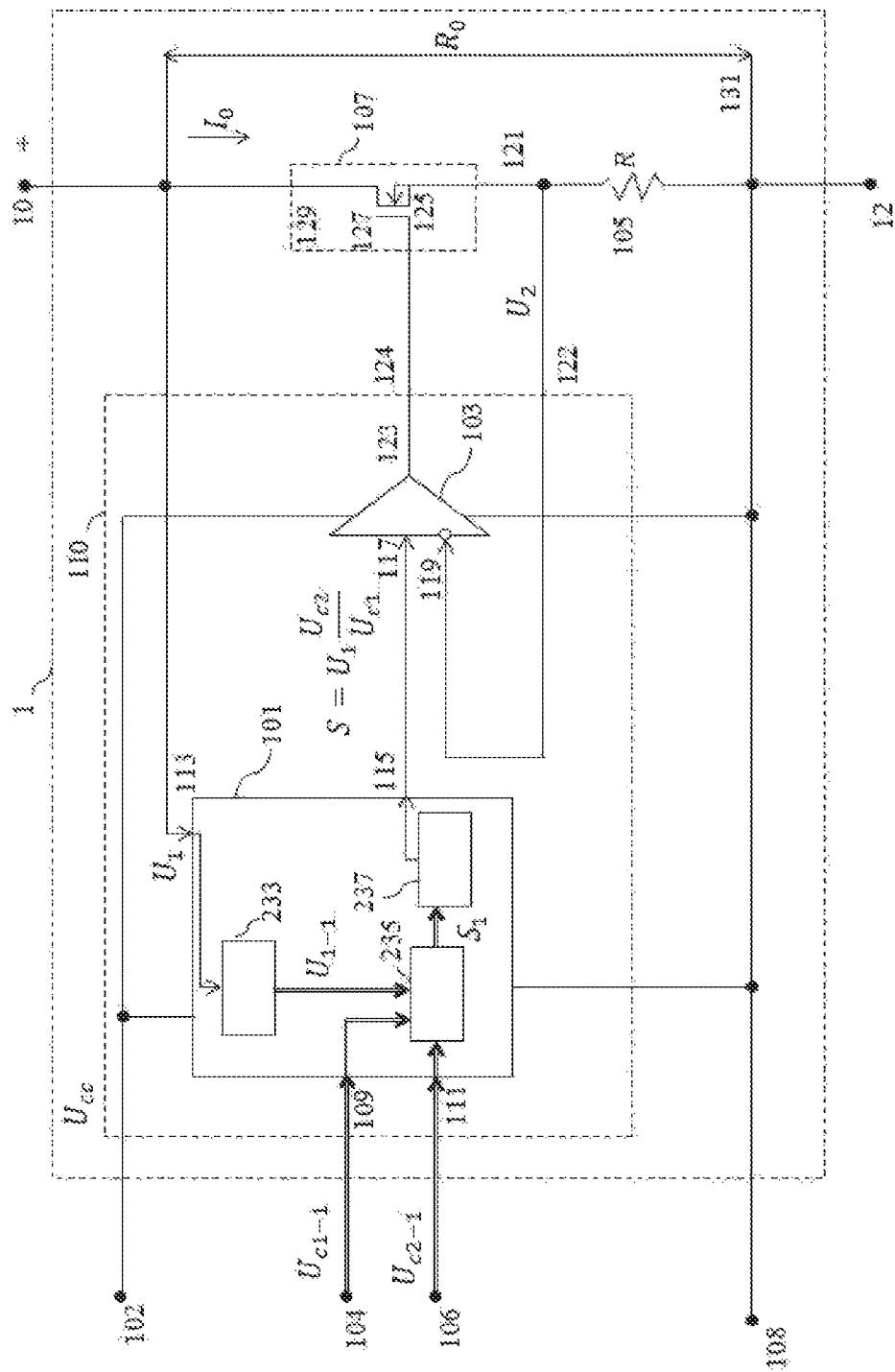
FIG. 2 illustrates one of possible variants of a digital implementation of the electronically controllable resistor according to the present invention.

Presented in FIGS. 1 and 2 is an electronically controllable resistor (ECR) 1 comprising a voltage converter 101, a subtractor 103 (including, for example, an operational amplifier), an instrument resistor 105, and an executive element 107. A first and a second inputs 109 and 111 of the voltage converter 101 are connected, respectively, to terminals 104 and 106 of the ECR 1 meant for being connected to a first and a second sources of controlling voltages (not shown). A third input 113 is connected to a high-potential terminal 10 of the ECR 1, and an output 115 of the converter 101 serves for supplying an intermediate signal to the subtractor 103. Power supply voltage comes to a terminal 102 of the ECR 1, whereas a terminal 108 is connected to a common wire. A voltage converter 101 and a subtractor 103 constitute a control circuit 110 for controlling the ECR. A first (non-inverting) input 117 of the subtractor 103 is connected to the output 115 of the voltage converter 101, a second (inverting) input 119 of the subtractor 103 is connected to a first terminal 121 of the instrument resistor 105 via an input 122 of the control circuit 110, and an output 123 of the subtractor 103 serves to supply via an output 124 of the control circuit 110 a control signal to the executive element 107 having, for example, three terminals. A first terminal 125 of the executive element 107 is connected, for example, to the first terminal of the instrument resistor 105, a second terminal 127, which is a control input of the executive element 107, is connected to the output 123 of the subtractor 103, whereas a third terminal 129 of the executive element 107 is connected, for example, to the high-potential terminal 10 of the ECR 1.

Also, a second terminal 131 of the instrument resistor 105 is connected to a low-potential terminal 12 and to the terminal 108 of the ECR 1. The high-potential, 10, and low-potential, 12, terminals serve to connect the ECR 1 into an electric circuit (not shown).

In a digital implementation (FIG. 2), ECR1 comprises voltage converter 101 which, in turn, comprises an analog-to-digital converter 233, a digital computing unit 235, and a digital-to-analog converter 237. An input of the analog-to-digital converter 233 is connected to a terminal 113 of the voltage converter 101. Coming to inputs of the digital computing unit 235 are controlling voltages in a digital form from the inputs 109 and 111 of the voltage converter 101 and a signal from an output of the analog-to-digital converter 233. The digital-to-analog converter 237 is connected by an input thereof to an output of the digital computing unit 235 and by an output thereof to an output 115 of the voltage converter 101.

The ECR designed in the above-discussed manner makes it possible to have controlled resistance of the ECR (between the high-potential and low-potential terminals thereof) which varies according to the following relation:

$$R_0 = U_{C1} * R / U_{C2} \quad (1),$$

i.e. the value $R_0$ of the resistance of the ECR is proportional to the preferred value R of the instrument resistor connected in series to the executive element, the proportionality factor being equal to quotient of the value $U_{C1}$ of the first controlling voltage to the value $U_{C2}$ of the second controlling voltage. Due to that, the proposed ECR can be employed not only in apparatuses where resistance should be controlled following a direct dependence thereof from the controlling voltage, but also where the dependence is inverse or where dependence from both variable controlling voltages takes place.

As distinct from the prototype, where only preferred large values of the instrument resistor can be obtained, the proposed ECR can, due to using the executive element that can pass big currents therethrough, obtain also preferred small values of the instrument resistor and, consequently, small values of resistance of the ECR.

According to FIG. 1, the ECR 1 operates as follows. Power supply voltage $U_{CC}$ is applied to terminals 102 and 108 of the ECR 1 and the first, $U_{C1}$, and second, $U_{C2}$, controlling voltages are applied to terminals 104 and 106 of the ECR 1 and, respectively to the inputs 109 and 111 of the voltage converter 101. Coming at the same time to the third input 113 of the voltage converter 101 from the high-potential terminal 10 of the ECR 1 is voltage $U_1$ corresponding to the potential difference between the high-potential, 10, and low-potential, 12, terminals of the ECR 1.

The voltage converter 101 converts the voltages $U_{C1}$, $U_{C2}$, and $U_1$ in such a way that being formed at the output 115 of the voltage converter 101 is an intermediate signal S having value equal to the product of the voltage $U_1$ at the high-potential terminal 10 of the ECR 1 by the quotient of the value of one controlling voltage, for example, the second one, by another controlling voltage, for example, the first one. The signal is illustrated by the relation:

$$S = U_1 * U_{C2} / U_{C1} \quad (2).$$

The voltage converter 101 can be realized in any known way, and, for example, according to the design described in T. V Mirina and N. V. Mirin, Functional electronic units of measuring and diagnostic systems, M., Flinta, 2012, 228, FIG. 11.3.

Figure 6:
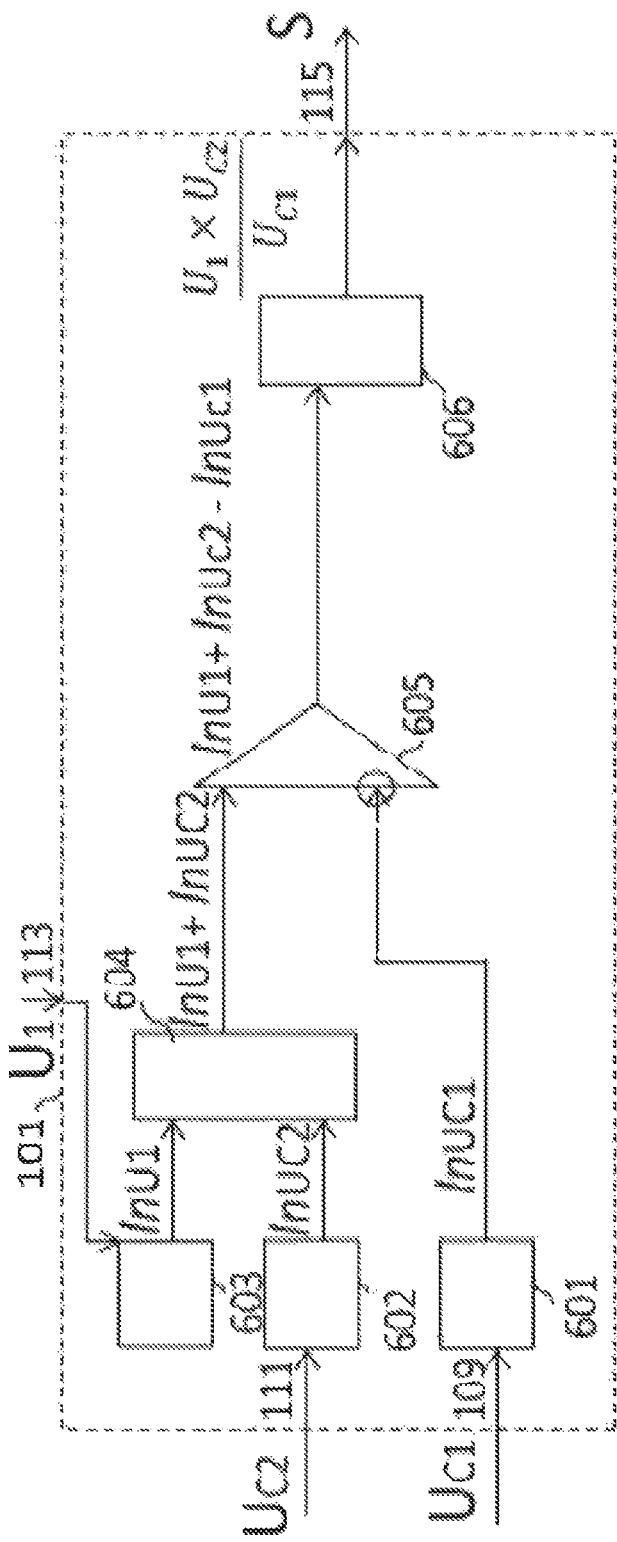
FIG. 6 shows one of possible implementations of a voltage converter.

Particularly, it is possible to implement the converter 101 using logarithmation and exponential (inverse) conversion and respective schematics shown in FIG. 6. There, 601, 602, and 603—logarithmic amplifiers performing conversion $U_{out} = \text{Ln}(U_{in})$, where $U_{out}$ and $U_{in}$ are, respectively, output and input voltage of the logarithmic amplifiers; 604—an adder realizing function $U_{out} = U_{in1} + U_{in2}$; 605 is an additional subtractor performing function $U_{out} = U_{in1} - U_{in2}$ where $U_{in1}$ and $U_{in2}$ are, respectively, signals at the non-inverting and inverting inputs of the subtractor 605; and 606 is an exponential converter carrying out function $U_{out} = \exp(U_{in})$.

With accepted designations in view, the voltage converter 101 operates as follows.

The controlling voltages $U_{C1}$ and $U_{C2}$ come to inputs of logarithmic amplifiers 601 and 602, respectively, and the voltage $U_1$ from the high-potential terminal 10 of the ECR 1 comes through the third input 113 of the voltage converter 101 to an input of the logarithmic amplifier 603. In consequence of logarithmic conversion, a signal Ln ($U_{C1}$) is generated from an output of the logarithmic amplifier 601, a signal Ln ($U_{C2}$) is generated from an output of the logarithmic amplifier 602, and a signal Ln ($U_1$) is generated from an output of the logarithmic amplifier 603. The logarithms of the input signals obtained in such a way are applied from an output of the logarithmic amplifier 601 to an inverting input of the additional subtractor 605, and from outputs of the logarithmic amplifiers 602 and 603, via the adder 604, to a non-inverting input of the additional subtractor 605. Due to that, a signal Ln ($U_1$)+Ln ($U_{C2}$)−Ln ($U_{C1}$) is generated at an output of the additional subtractor 605. After conversion in the exponential converter 606, a signal is generated at an output thereof, the signal being the output signal of the voltage converter 101:

$$S = U_1 * U_{C2} / U_{C1} \quad (2).$$

The intermediate signal formed in the above manner comes from the output 115 of the voltage converter 101 to the first, non-inverting, input 117 of the subtractor 103 and coming to the second, inverting, input 119 of the subtractor 103 from the first terminal 121 of the instrument resistor 105 is voltage $U_2$. The value of $U_2$ is equal to the drop in voltage across the resistor 105 caused by current $I_0$ of the executive element 107. The $I_0$ flows, due to the potential difference $U_1$ between the high-potential, 10, and low-potential, 12, terminals of the ECR 1, in the following circuit: the high-potential terminal 10—the executive element 107—the instrument resistor 107 connected in series with the executive element 107—the low-potential terminal 12.

Consequently, the value of the voltage $U_2$ is expressed by the relation:

$$U_2 = I_0 * R \quad (3),$$

where R is the preferred value of the instrument resistor, which value can be chosen as small as possible with the technical implementation in view.

Applied from the output 123 of the subtractor 103 to the control input of the executive element 107 is the voltage proportional to the difference between the intermediate signal S at the first, non-inverting, input 117 of the subtractor 103 and the voltage $U_2$ at the second, inverting, input 119 of the subtractor 103. If the value of the intermediate signal S is larger than the value of the voltage $U_2$, then the voltage at the control terminal 127 of the executive element 107 opens the executive element 107, current $I_0$ through same increases, resulting in the increase of the voltage $U_2$. This process will continue until the value of the voltage $U_2$ becomes equal to the value of the intermediate signal S.

On the other hand, if the value of the intermediate signal S is less than the value of the voltage $U_2$, then the voltage at the control terminal 127 of the executive element 107 will be closing the executive element 107, current $I_0$ through same decreases, resulting in the decrease of the voltage $U_2$. This process will continue until the value of the voltage $U_2$ becomes equal to the value of the intermediate signal S.

Hereby, due to the presence of feedback encompassing the executive element 107, the instrument resistor 105, and the subtractor 103, the ratio $$S \approx U_2 \quad (4)$$

will always be abided in the proposed design, or, applying the respective values for S and $U_2$ from (2) and (3), $$U_{C2}*U_1/U_{C1}=I_0*R \qquad (5)$$

The ratio (4) performs stably from exposure to various destabilizing factors, including wide range temperature variations, which is ensured by the depth of the feedback.

By taking into consideration that the value of the resistance $R_O$ between the high-potential, 110, and the low-potential, 112, terminals of the ECR 1 is equal to the quotient of the voltage $U_1$ by the current $I_0$ flowing through serially connected the executive element 107 and the instrument resistor 105:

$$R_O=U_1/I_0 \qquad (6),$$

the ratio (1): $R_O=U_{C1}*R/U_{C2}$, can be derived from (5) and (6).

It follows from that that by means of forming the intermediate signal at the output of the voltage converter 101 as $$S=U_{C1}*U_1/U_{C2},$$

further applying this signal to the first, non-inverting, input 117 of the subtractor 103, applying the voltage $U_2=I_0*R$ across the instrument resistor to the second, inverting, input 119 of the subtractor 103, and ensuring the equality $S \approx U_2$ due to the above-discussed feedback, the value of the resistance $R_O$ of the ECR 1 is made proportional to the preferred value of the instrument resistor R connected in series with the executive element, and the proportionality factor is equal to the ratio of the value of the first controlling voltage to the value of the second controlling voltage.

Also following from the ratio (6) is the feasibility of obtaining small and ultra-small values of $R_O$ at the sufficiently large $I_0$ provided by the executive element.

Therefore, used to control resistance of a portion of an electric circuit are variations of values of $U_{C1}$ and/or $U_{C2}$, whereby either a directly proportional or an inversely proportional or a combined function can be achieved depending on the requirements imposed on the ECR.

The directly proportional dependence of the ECR from the controlling voltage can be achieved if the value of $U_{C2}$ is made fixed in any technically feasible way and only the value of $U_{C1}$ is varied.

The inversely proportional dependence of the ECR from the controlling voltage can be achieved if the value of $U_{C1}$ is made fixed in any technically feasible way and only the value of $U_{C2}$ is varied.

The combine function can be achieved where both $U_{C1}$ and $U_{C2}$ vary according to a preset rule.

The ECR according to FIG. 2 (the second, digital, implementation) operates as follows.

Power supply voltage $U_{CC}$ is applied to the terminals 102 and 108 of the electronically controllable resistor, whereas the first and second digital controlling voltages $U_{C1-1}$ and $U_{C2-1}$ are applied to terminals 104 and 106, respectively. Since the terminals 104 and 106 are connected to terminals 109 and 109, respectively, the first and the second digital controlling voltages $U_{C1-1}$ and $U_{C2-1}$ come to terminals 109 and 109 of the voltage converter 101. At the same time, voltage $U_1$, corresponding to the potential difference between the high-potential, 10, and low-potential, 12, terminals of the ECR, is applied from the high-potential terminal 10 to the third input 113 of the voltage converter 101.

Carried out in the analog-to-digital converter 233 of the voltage converter 101 is conversion of the analog voltage $U_1$ into a digital form $U_{1-1}$ thereof. Resulting digital codes together with digital controlling voltages $U_{C1-1}$ and $U_{C2-1}$ come to inputs of the digital computing unit 235 to be converted in such a way as to form an intermediate signal $S_1$ at respective outputs thereof. Just as in the implementation shown in FIG. 1, the value of the $S_1$ is equal to the product of the digital value $U_{1-1}$ of the voltage at the high-potential terminal by the quotient of the value of the second controlling voltage by the value of the first controlling voltage and is defined by the following ratio:

$$S1=U_{1-1}*U_{C2-1}/U_{C1-1} \qquad (7)$$

Figure 7:
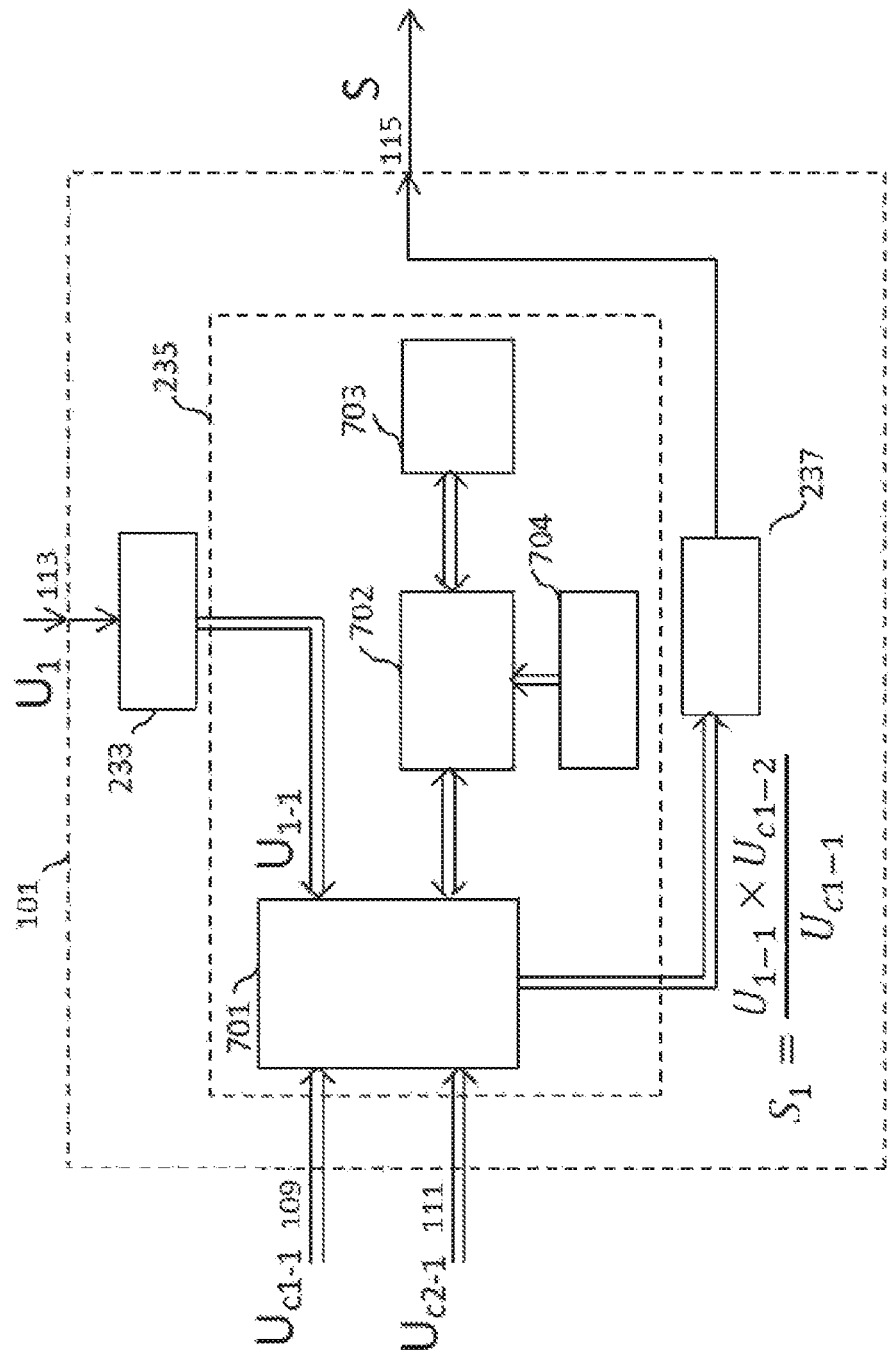
FIG. 7 shows another one of possible implementations of a voltage converter.

Alternatively, the voltage converter 101 can be made using a microprocessor, as shown in FIG. 7. Designated in FIG. 7 are: an input-output unit 701, an arithmetic-logical unit 702, a random-access memory 703, a read-only memory 704. As in FIG. 2, 233 is the analog-to-digital converter and 237 is a digital-to-analog converter.

Made and designated in the above-mentioned manner, the voltage converter 101 operates as follows.

The first, $U_{C1-1}$, and the second, $U_{C2-1}$, digital controlling voltages come to inputs of the input-output unit 701. The voltage $U_1$ from the high-potential terminal 10 of the ECR (FIG. 2) comes to the input 113 of the voltage converter 101 and then, after conversion into digital form in the analog-to-digital converter 233, is also applied, as digital voltage $U_{1-1}$, to the input-output unit 701. The input-output unit 701 transfers the digital voltages $U_{C1-1}$, $U_{C2-1}$, and $U_{1-1}$ to the arithmetic-logical unit 702 which, according to a program saved in the read-only memory 704, calculates the intermediate signal $S_1$ in digital form $$S_1=U_{1-1}*U_{C2-1}/U_{C1-1},$$

exchanging intermediate results of the calculations with the random-access memory 703. From the arithmetic-logical unit 702, the obtained digital intermediate signal $S_1$ comes to the input-output unit 701, and the latter transfers that signal to the inputs of the digital-to-analog converter 237. The digital-to-analog converter 237 transforms the digital signal $S_1$ into the analog form S thereof in accordance with the relation (2).

Similar to the first, analog, implementation, the intermediate signal S formed in the above-discussed way comes from the output 115 of the voltage converter 101 to the first (non-inverting) input 117 of the subtractor 103. Applied to the second (inverting) input 119 of the subtractor 103 is voltage $U_2$ coming from the first terminal 121 of the instrument resistor 105. The value of $U_2$ is equal to the voltage drop at the instrument resistor 105 produced by current $I_0$ of the executive element 107. Due to the difference $U_1$ in potential between the high-potential terminal 10 and the low-potential terminal 12 of the ECR, the current $I_0$ flows through the circuit comprising the high-potential terminal 10, the executive element 107, the instrument resistor 105 connected in series with the latter, and the low-potential terminal 12.

In the same manner that takes place in the implementation shown in FIG. 1, value of $U_2$ can be expressed by the ratio $$U_2=I_0*R, \qquad (3),$$

where R is the preferred value of the instrument resistor, which can be chosen as small as engineering implementation allows.

The resulting voltage, which is proportional to the difference between the intermediate signal S at the first (non-inverting) input 117 of the subtractor 103 and voltage $U_2$ at the second (inverting) input 119 of the subtractor 103, is applied from the output 123 of the subtractor 103 to the control terminal 127 of the executive element 107. If the value of the intermediate signal S is larger than the value of the voltage $U_2$, then the voltage at the control terminal 127 of the executive element 107 opens the executive element 107, the current $I_0$ through same increases, resulting in the increase of the voltage $U_2$. This process will continue until the value of the voltage $U_2$ becomes equal to the value of the intermediate signal S.

If, on the other hand, the value of the intermediate signal S is less than the value of the voltage $U_2$, the voltage at the control terminal 127 of the executive element 107 will be closing the executive element 107, current $I_0$ therethrough decreases, resulting in the decrease of the voltage $U_2$. This process will continue until the value of the voltage $U_2$ becomes equal to the value of the intermediate signal S.

Hereby, due to the presence of feedback encompassing the executive element 107, the instrument resistor 105, and the subtractor 103, the ratio $$S \approx U_2 \qquad (4),$$

similar to the implementation illustrated by FIG. 1, will always be abided in the ECR 2 as shown in FIG. 2. Applying the respective values for S and $U_2$ from (2) and (3), $$U_{C2\text{-}1} \cdot U_1 / U_{C1\text{-}1} = I_0 \cdot R$$

Ensured by the depth of the feedback, the ratio (4) performs stably from exposure to various destabilizing factors, including wide range temperature variations.

When reasoning the same way as related to the version shown in FIG. 1, the ratio (1) again can be obtained:

$$R_0 = U_{C1\text{-}1} \cdot R / U_{C2\text{-}1},$$

where the controlling voltages are presented in a digital form.

It follows from the above that when the voltage converter 101 comprises an aggregation of the analog-digital converter, the digital computing unit, and the digital-to-analog converter, with the above-mentioned connection between them, it becomes possible, similar to the variant shown in FIG. 1, to control resistance of the ECR, which resistance will be proportional to the preferred value of the instrument resistor connected in series with the executive element, and the proportionality factor will be equal to the ratio of the value of the first controlling voltage to the value of the second controlling voltage.

Therefore, it is variations of values of $U_{C1\text{-}1}$ and/or $U_{C2\text{-}1}$ that are used to control resistance of a portion of an electric circuit, to thereby achieve either a directly proportional function, or an inversely proportional function, or a combined function depending on the requirements imposed on the ECR.

The directly proportional dependence of the ECR from the controlling voltage can be achieved if the value of $U_{C2\text{-}1}$ is made fixed in any technically feasible way and only the value of $U_{C1\text{-}1}$ is varied.

The inversely proportional dependence of the ECR from the controlling voltage can be achieved if the value of $U_{C1\text{-}1}$ is made fixed in any technically feasible way and only the value of $U_{C2\text{-}1}$ is varied.

The combine function can be achieved where both $U_{C1\text{-}1}$ and $U_{C2\text{-}1}$ vary according to a preset rule.

It follows from the above that the technical result ensured by the proposed ECR lies in widening the range of values of the preferred values of the resistance of the ECR, mainly to the side of small values thereof. While maintaining high tolerance to destabilizing factors, the value of the resistance of the portion of the electric circuit where the ECR is placed can be as low as possible, with the technical implementation in view.

It is understood by those skilled the art that, when implementing the ECR, various versions of the technical realization of the voltage converter 101 can be used. For example, the multiplication and division operations can be performed in an arbitrary order:

either performed first is the $U_1 * U_2$ operation, and then the result is divided by $U_{C1}$; or first performed is the $U_1/U_{C1}$ operation, and then the result is multiplied by $U_{C2}$; or the operation $U_{C2}/U_{C1}$ is performed in the beginning followed by multiplying the result by $U_1$;

or the operations $U_{C1} * U_1 / U_2$ are performed in parallel, as, for example, shown in E. A. Kolombet, Microelectronic devices for processing analog signals, M., Radio and Svyaz', 1991, 62, FIG. 3.1.

The multiplication can be performed in many ways, for example as disclosed in "Analog multipliers" in A. V. Mikushin and V. I. Sedinin, Electronic units and systems design, SibGUTI, Novosibirsk, 2017, 116, FIG. 3.13, or in "Analog signal multiplier" in T. V. Mirina and N. V. Mirin, Functional electronic units of measuring and diagnostic systems, M., Flinta, 2012, 228, FIG. 11.7.

Specifically, commonly used are:

ring multipliers using bipolar transistors (IC AD530, AD534, AD834, and many others);

pulse multipliers;

logarithmic multipliers;

variable slope multipliers, etc.

The division can also be implemented in many ways (for example, as disclosed in "Analog signal divider" in E. A. Kolombet, Microelectronic devices for processing analog signals, M., Radio and Svyaz', 1991, 67, FIG. 3.6.):

by means of a conventional amplifier-inverter where a multiplier is included in series with the feedback resistor;

using a variable-slope method;

using a method of taking logarithms, etc.

Where controlling signals come in a digital form, the voltage converter 101 can be implemented using the digital computing unit, as discussed in the above and illustrated by FIG. 2. In this case, the multiplication and division can be performed by using software with any suitable microprocessor. Also, the multiplication and division can be performed by hardware, such as combinatorial multipliers/dividers or programmable logic devices (PLD).

Those skilled in the art also understand that the executive element 107 can include MOS- or bipolar transistors, or electronic tubes, etc.

All the other elements of the apparatus implementing the present invention are well-known and discussed in technical literature.

The above-discussed examples are not intended to limit the scope of the present invention.

For example, the range of the preferred values of the instrument resistor can be chosen from several Ohm down to several milliohm.

Figure 3:
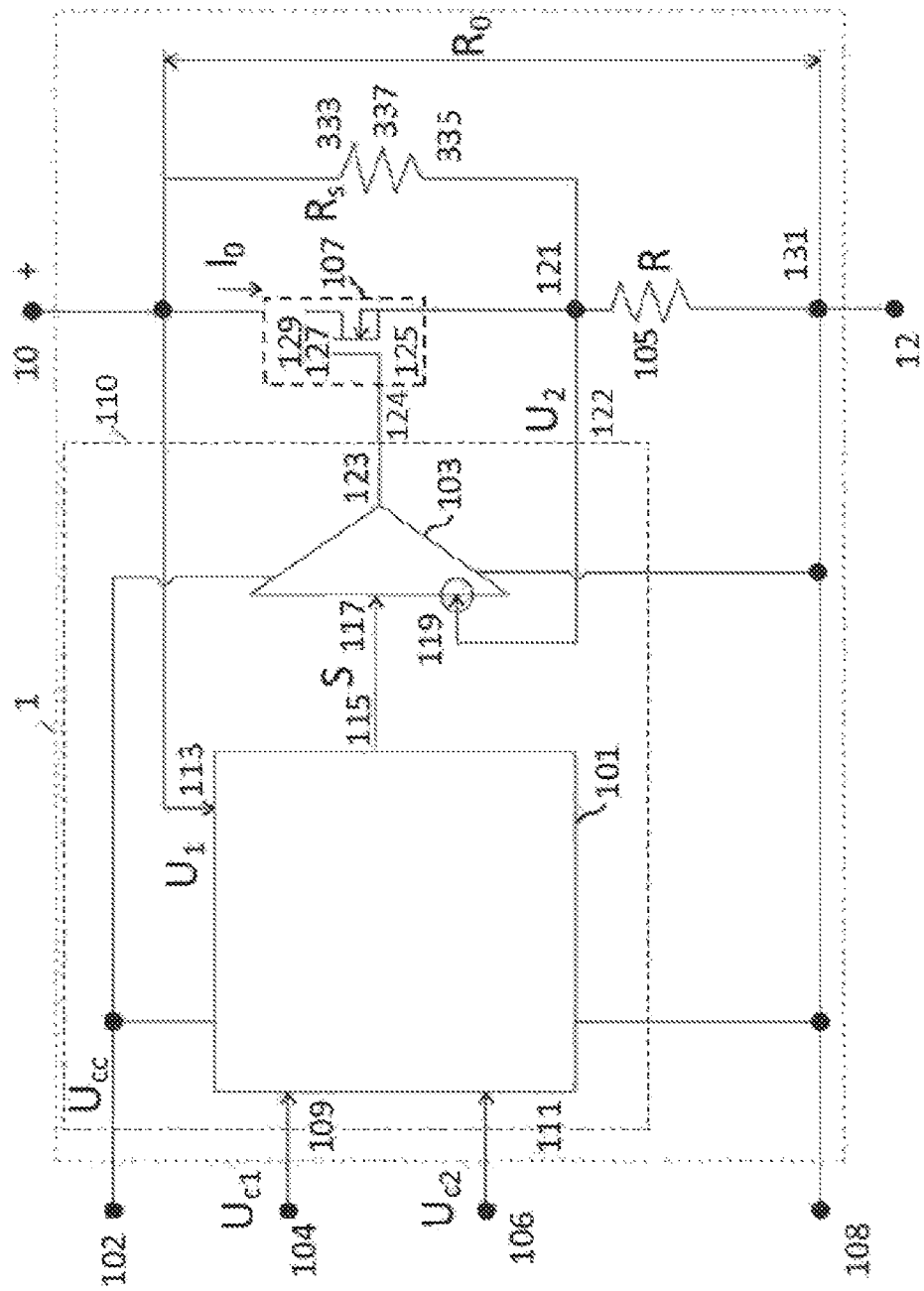
FIGS. 3 and 4 show modifications of the electronically controllable resistor shown, respectively, in FIGS. 1 and 2.
Figure 4:
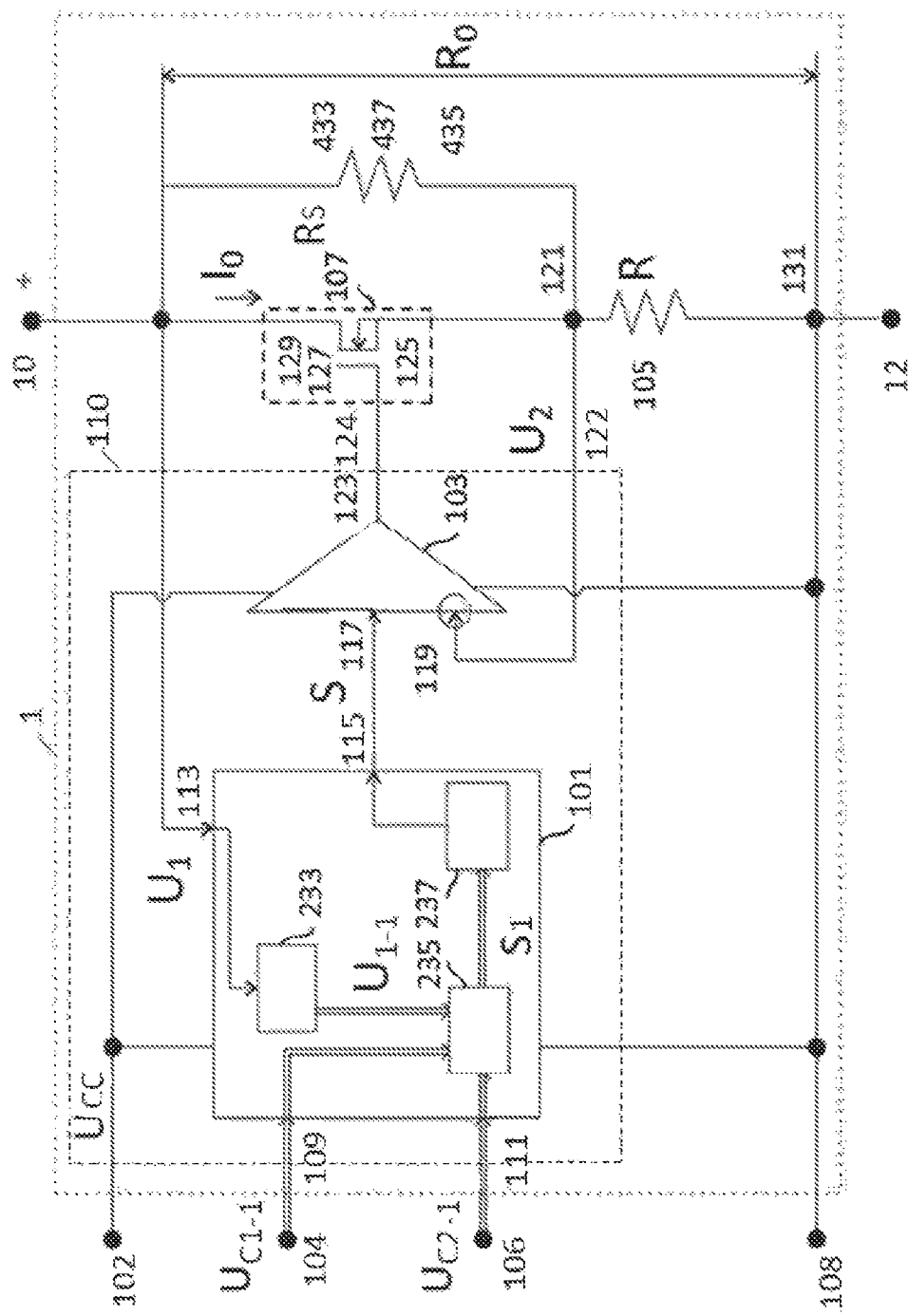

To protect the executive element 107 (207) against transients, a parallel connection of an additional resistor R s 337 (437) shown in FIG. 3 (FIG. 4) can be used. Terminals 333 (433) and 335 (435) of the resistor R s are respectively connected to the terminals 129 and 125 of the executive element 107.

The ECR illustrated by FIG. 1 can be made, for example, as a chip or a chip assembly or a microplate, the terminals thereof being 102, 104, 106, 108, 10, 12 (FIG. 1).

The ECR shown in FIG. 1 can also be made, for example, as a chip or a chip assembly or a microplate, the terminals thereof being 102, 104, 106, 108, 10, 12, 12, 122, and 124, the executive element 107 being connected by terminals 125, 127, 129 thereof to the terminals 121, 124, 10, respectively (FIG. 1).

The ECR presented in FIG. 2 can be made, for example, as a chip or a chip assembly or a microplate, the terminals thereof being 102, 104, 106, 108, 10, 12, and the terminals 104 and 106 can include groups of terminals complying with serial interfaces or parallel interfaces, such as I²C, SPI, increment-decrement.

The ECR depicted in FIG. 2 can also be made, for example, as a chip or a chip assembly or a microplate, the terminals thereof being 102, 104, 106, 108, 10, 12, 122, and 12, and the terminals 104 and 106 can include groups of terminals complying with serial interfaces or parallel interfaces, such as I²C, SPI, increment-decrement, whereas the executive element 107 can be connected by the terminals 125, 127, 129 to respective terminals 121, 124, and 10.

Functionality of the present ECR is substantially wider than that of the prior art, because it makes it possible to realize mainly, but not limited to, a low-ohmic ECR that can be used in the apparatuses where it is needed to control resistance both in direct dependence and inverse dependence on the controlling voltage, as well as in dependence on both variable controlling voltages. With that, controlling resistance can be implemented by using either analog controlling voltages or digital controlling codes, whereas current flowing through the ECR can amount up to 10 A and more.

Battery charging devices, power factor correction devices for secondary power supply units, synchronous motors, etc. are examples of such apparatuses.

Therefore, the proposed solution is best-placed to be widely used in various fields of electronics and electrical engineering for controlling resistance of a portion of an DC and AC electric circuit and, hence, for controlling voltage, current, and power of desired signals.

Figure 5:
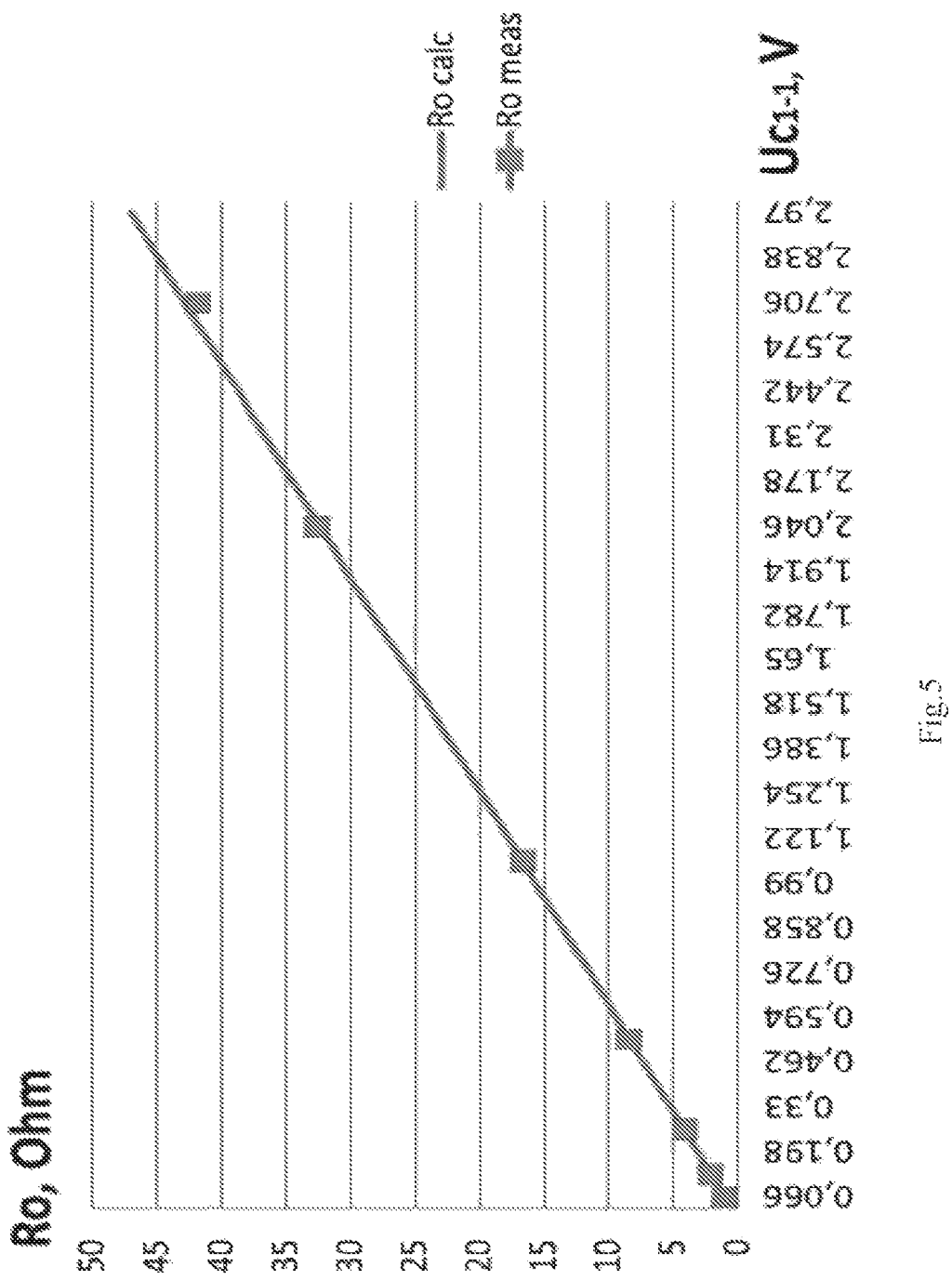
FIG. 5 illustrates resistance of the electronically controllable resistor versus controlling voltage response characteristic.

A real ECR was made according to the second option (using digital schematics). It was tested at fixed values of $U_{C2-1}$, whereas the first controlling voltage $U_{C1-1}$ varied. FIG. 5 illustrates the dependence of resistance $R_0$ of the ECR from $U_{C1-1}$. It shows that the measured values of the resistance of the ECR, $R_{0\ meas}$ are in direct proportion to the values of $U_{C1-1}$ and highly linear, no matter what values of $U_1$ are (for reference, calculated values, $R_{0\ calc}$, are shown as well). There, the values of $R_{0\ meas}$ are demonstrated in the range from 1.045 Ohm at $U_{C1-1}$ equal to 0.02 V to 40 Ohm at $U_{C1-1}$ equal to 0.85 V. No other apparatus known in the art and used for controlling resistance of a portion of an electric circuit ensures so small value of $R_0$.

It is understood that the examples provided do not limit the scope of the present invention. For example, hardware portions of some elements disclosed in the above can differ or partially coincide or completely coincide with hardware portions of some other elements unless otherwise is clearly indicated. Also, hardware portions of some elements can be placed into various portions of some other elements unless otherwise is clearly indicated.

What is claimed is:

1. An electronically controllable resistor (ECR) (1) comprising: a voltage converter (101), an instrument resistor (105), and a subtractor (103), the voltage converter (101) has a first, a second, and a third inputs (109, 111, 113), the first input (109) is connected to a terminal (104) for connecting to a first control voltage source, and the third input (113) is connected to a high-potential voltage terminal (10), a first input (117) of the subtractor (103) is connected to an output (115) of the voltage converter (103), a second input (119) of the subtractor (103) is connected to a first terminal (121) of the instrument resistor (105), a second terminal of the instrument resistor (105) being connected to a low-potential terminal (12),
wherein
the second input (111) of the voltage converter (101) is connected to a terminal (106) for connecting to a second control voltage source, the ECR (1) further comprises an executive element (107), a first terminal (125) of the executive element (107) is connected to the first terminal (121) of the instrument resistor (105), a second terminal (127) of the executive element (107) is connected to an output (123) of the subtractor (103), and a third terminal (129) of the executive element (107) is connected to the high potential terminal (10), and
wherein the voltage converter (101) is adapted to multiply a voltage at the high-potential terminal (10) by a voltage at the second input (111) and to divide by a voltage at the first input (109), to produce an intermediate voltage signal at the output (115) of the voltage converter (101), whereby regulating a resistance of the ECR becomes available by the subtractor (103) in a function of the difference between the intermediate voltage signal and a voltage drop on the instrumental resistor (105) applied to the subtractor (103), the voltage drop being created by a current flowing through the instrumental resistor and the executive element.

2. The ECR (1) as claimed in claim 1, wherein
the voltage converter (101) comprises three logarithmic amplifiers (601, 602, 603), connected in parallel to each other, an adder (604), an additional subtractor (605), and an exponential converter (606),
wherein
an input of the first logarithmic amplifier (603) is connected to the high-potential terminal (10) through the input (113) of the voltage converter (101), the second logarithmic amplifier (602) is connected to the input (111) of the voltage converter (101), the third logarithmic amplifier (601) is connected to the input (109) of the voltage converter (101), outputs of the first logarithmic amplifier (603) and of the second logarithmic amplifier (602) are connected to inputs of the adder (604), an output of the adder (604) is connected to a non-inverting input of the additional subtractor (605), an output of the third logarithmic amplifier (601) is connected to an inverting input of the additional subtractor (605), an output of the additional subtractor (605) is connected to an input of the exponential converter (606), an output of the exponential converter (606) includes the output (115) of the voltage converter (101).

3. The ECR (1) of claim 1, wherein the voltage converter (101) comprises a digital computing unit (235), an analog-to-digital converter (233), and a digital-to-analog converter (237),
an input of the analog-to-digital converter (233) being connected to the third input (113) of the voltage converter (101), an output of the analog-to-digital converter (233) being connected to an input of the digital computing unit (235), a second input of the digital computing unit (235) being connected to the second input (111) of the voltage converter (101), a third input of the digital computing unit (235) being connected to the first input (109) of the voltage converter (101), an output of the digital computing unit (235) being connected to an input of the digital-to-analog converter (237), an output of the digital-to-analog converter (237) including the output (115) of the voltage converter (101), and wherein the first input (109) of the voltage converter (101) is a digital bus, and wherein the second input (111) of the voltage converter (101) is also a digital bus.

4. The ECR (1) of claim 1, wherein the executive element (107) includes a FET.

5. The ECR (1) of claim 1, wherein the executive element (107) includes a bipolar transistor.

6. The ECR (1) of claim 1, wherein the executive element (107) includes at least one vacuum tube.

7. A circuit for controlling the ECR (1), the circuit comprising a voltage converter (101) and a subtractor (103), the voltage converter (101) having first, second and third inputs (109, 111, 113), the first input (109) is for connecting to a source of a first control voltage, and the third input (113) is for connecting to a high-potential voltage terminal (10) of the ECR (1), a first input (117) of the subtractor (103) is connected to an output (115) of the voltage converter (103), a second input (119) of the subtractor (103) is for connecting to a first terminal (121) of an instrument resistor (105) of the ECR (1), wherein the second input (111) of the voltage converter (101) is for connecting to a source of a second control voltage, an output (123) of the subtractor (103) is for connecting to a control input of an executive element of the ECR (1); and wherein the voltage converter (101) is adapted to multiply a voltage at the high-potential terminal (10) of the ECR (1) by a voltage at the second input (111) and to divide by a voltage at the first input (109), to produce an intermediate voltage signal at the output (115) of the voltage converter (101), whereby regulating a resistance of the ECR (1) becomes available by the subtractor (103) in a function of the difference between the intermediate voltage signal and a voltage drop on the instrumental resistor (105) of the ECR (1) applied to the subtractor (103), which voltage drop is created by a current flowing through the instrumental resistor (105) and the executive element (107) of the ECR (1).

8. The circuit of claim 7 for controlling the ECR (1), wherein the voltage converter (101) includes three logarithmic amplifiers (601, 602, 603), connected in parallel to each other, an adder (604), an additional subtractor (605), and an exponential converter (606), wherein an input of the first logarithmic amplifier (603) is for connecting to the high-potential terminal (10) through the input (113) of the voltage converter (101), an input of the second logarithmic amplifier (602) is connected to the input (111) of the voltage converter (101), an input of the third logarithmic amplifier (601) is connected to the input (109) of the voltage converter (101), outputs of the first logarithmic amplifier (603) and of the second logarithmic amplifier (602) are connected to inputs of the adder (604), an output of the adder (604) is connected to a non-inverting input of the additional subtractor (605), an output of the third logarithmic amplifier (601) is connected to an inverting input of the additional subtractor (605), an output of the additional subtractor (605) is connected to an input of the exponential converter (606), an output of the exponential converter (606) including the output (115) of the voltage converter (101).

9. The circuit of claim 7 for controlling the ECR (1), wherein the voltage converter (101) comprises a digital computing unit (235), an analog-to-digital converter (233), and a digital-to-analog converter (237), an input of the analog-to-digital converter (233) being connected to the third input (113) of the voltage converter (101), a first input of the digital computing unit (235) being connected to an output of the analog-to-digital converter (233), a second input of the digital computing unit (235) being connected to the second input (111) of the voltage converter (101), a third input of the digital computing unit (235) being connected to the first input (109) of the voltage converter (101), an input of the digital-to-analog converter (237) being connected to an output of the digital computing unit (235), an output of the digital-to-analog converter (237) including the output (115) of the voltage converter (101), and wherein the first input (109) of the voltage converter (101) is a digital bus, and wherein the second input (111) of the voltage converter (101) is also a digital bus.

* * * * *